United States Patent
Takahashi et al.

(10) Patent No.: US 7,560,683 B2
(45) Date of Patent: Jul. 14, 2009

(54) PHOTO DETECTING CIRCUIT AND NOISE ELIMINATION METHOD UTILIZED TO PRODUCE A PHOTO RECEPTION SIGNAL

(75) Inventors: Seigo Takahashi, Tokyo (JP); Akio Tajima, Tokyo (JP); Takeshi Takeuchi, Tokyo (JP); Akihiro Tanaka, Tokyo (JP); Wakako Maeda, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 11/392,575

(22) Filed: Mar. 30, 2006

(65) Prior Publication Data
US 2006/0219871 A1  Oct. 5, 2006

(30) Foreign Application Priority Data
Mar. 31, 2005 (JP) ............... 2005-100811

(51) Int. Cl.
*G01J 1/44* (2006.01)
*H01J 40/14* (2006.01)
*H03F 3/08* (2006.01)

(52) U.S. Cl. ............... 250/214 R; 250/214.1; 250/214 DC; 250/214 AG

(58) Field of Classification Search .............. 250/214.1, 250/214 R, 214 A, 214 AG, 214 DC; 380/255
See application file for complete search history.

(56) References Cited

U.S. PATENT DOCUMENTS

| | | | |
|---|---|---|---|
| 4,399,564 A | 8/1983 | Cowen | |
| 4,464,048 A * | 8/1984 | Farlow | 356/5.08 |
| 5,410,145 A * | 4/1995 | Coroy | 250/214 C |
| 5,929,982 A * | 7/1999 | Anderson | 356/73.1 |
| 2004/0184615 A1* | 9/2004 | Elliott et al. | 380/283 |

OTHER PUBLICATIONS

Kosaka et al., "Single-Photon Interference Experiment Over 100 km For Quantum Cryptography System Using Balanced Gated-Mode Photon Detector," Electronics Letters, vol. 39, No. 16, Aug. 7, 2003, pp. 1199-1201.

Prochazka, "Peltier-Cooled and Actively Quenched Operation of InGaAs/InP Avalanche Photodiodes As Photon Counters At A 1.55-µm Wavelength," Applied Optics, vol. 40, No. 33, Nov. 20, 2001, pp. 6012-6018.

Patent Abstracts of Japan, vol. 013, No. 509, Nov. 15, 1989, abstract only.

* cited by examiner

*Primary Examiner*—Thanh X Luu
*Assistant Examiner*—Francis M Legasse, Jr.
(74) *Attorney, Agent, or Firm*—Foley & Lardner LLP

(57) ABSTRACT

In a photo detecting circuit using an avalanche photodiode (APD), a pulse noise mask signal indicating the timing of occurrence of a pulse noise is generated by XORing a reverse-bias-pulse application timing signal and its delayed signal. Pulse noises are eliminated by ANDing an output signal of the APD and the pulse noise mask signal. Alternatively, a pulse noise is estimated by taking the average for the output current signal a given number of times. Pulse noises are eliminated by subtracting the estimated pulse noise from the APD output signal.

15 Claims, 7 Drawing Sheets

PHOTO DETECTING CIRCUIT AND NOISE ELIMINATION METHOD UTILIZED TO PRODUCE A PHOTO RECEPTION SIGNAL

BACKGROUND OF THE INVENTION

1. Field of the Invention

The present invention relates to a photo detecting method for eliminating a pulse noise caused by a pulse bias circuit and, more particularly, to a noise elimination periodically applied to a photo detecting device, and also to a photo receiving circuit using the noise elimination method.

2. Description of the Related Art

In the field of photon detection, an avalanche photodiode (hereinafter, referred to as APD) is generally used as an element for detecting a single photon. A basic photon detection technique is as follows. A reverse-bias voltage not less than an APD breakdown voltage (VBd) is applied to an APD so that the multiplication factor of the APD is increased to an extremely large value, whereby a photocurrent triggered by a single photon is amplified to such an extent that the signal amplitude becomes large enough for an external circuit to be able to process the signal.

As is well known, once an APD to which a reverse-bias voltage not less than VBd is applied is broken down and a multiplication current flows, this breakdown state continues regardless of which of a photon signal and a dark noise has caused the breakdown. Therefore, in general, a reverse-bias voltage not less than VBd is periodically applied in the form of pulses, in synchronization with the timing when a photon is expected to arrive at the APD. Such a reverse-bias pulse to be applied to the APD defines periodicity by which the reverse-bias voltage decreases below VBd when clearly no photon signal is expected to arrive. Thus, the breakdown state can be stopped.

However, applying the reverse-bias voltage in the form of a pulse to an APD causes a differential-waveform signal having a waveform determined according to the parasitic capacitance of the APD device and a change over time in the voltage of the reverse-bias pulse. When this differential-waveform signal is outputted, a signal decision circuit at a subsequent stage may erroneously decide that it is a photon-detection signal, which becomes a cause of degrading its ultimate signal error rate. Accordingly, there have been proposed several countermeasures against pulse noises.

For example, when a reverse-bias pulse is simultaneously applied to two APDs, these APDs each output differential-waveform signals having the substantially same differential waveform. Therefore, these differential-waveform signals can be eliminated from the outputs of the two APDs through a subtraction circuit employing a hybrid coupler (see Kosaka, H. et al. "Single-photon interference experiment over 100 km for quantum cryptography system using balanced gated-mode photon detector" ELECTRONICS LETTERS, Aug. 7, 2003, Vol. 39, No. 16, p. 1200).

Moreover, according to Prochazka, I. "Peltier-cooled and actively quenched operation of InGaAs/InP avalanche photodiodes as photon counters at a 1.55-μm wavelength" APPLIED OPTICS, Vol. 40, No. 33, pp. 6012 to 6018 (Nov. 20, 2001), a capacitor equivalent to the parasitic capacitance of an APD is arranged in parallel and the same pulse bias is applied to the APD and the capacitor (see FIG. 2). In this arrangement, the capacitor outputs a pulse noise having the same waveform as the output of the APD. Accordingly, these pulse noise outputs can be eliminated through a subtraction circuit employing an operational amplifier.

As described above, the use of the above-described subtraction circuit can prevent the decision circuit at the subsequent stage from erroneously deciding a pulse noise to be a photocurrent signal and therefore makes it possible to carry out decision only on a photocurrent signal from the APD.

However, the above-described conventional pulse noise elimination methods require a subtraction circuit such as a hybrid coupler or an operational amplifier, and therefore it has been difficult to achieve enhanced speed. A hybrid coupler is a circuit employing a plurality of coils and, because of its physical structure and manufacture precision, has difficulty in achieving higher speed as well as a wider band. For example, in the case of a photon detector using a reverse-bias pulse with a pulse width of one nanosecond, an output signal from the APD also has a pulse width of about one nanosecond, which means that a signal bandwidth of around one GHz is required.

The problem with enhancing speed is not limited to the hybrid coupler-based circuitry but similarly exists in electronic circuit-based circuitry using an operational amplifier as a subtraction circuit. This is because, in the case of the electronic circuit, the processing by the subtraction circuit, which is required for photon detection, is common-mode processing. The common-mode processing, in a general design technique for high-speed circuits, tends to deteriorate in performance as the bandwidth increases. For a commercially available operational amplifier, this performance is generally provided as a common-mode rejection ratio (CMRR) on a data sheet.

In addition, according to the above-described conventional pulse noise elimination methods, pulse noise elimination is performed by analog subtraction of signal waveforms using a subtraction circuit such as a hybrid coupler or an operational amplifier. Therefore, these methods are based on the precondition that the pulse noises outputted from, for example, two APDs have the same shapes. Pulse noises cannot be completely eliminated if the characteristics of two APDs and peripheral circuits are different from each other. Accordingly, it is necessary that the characteristics of the pair of APDs be made equal.

Differences in the above-mentioned characteristics include: for example, a difference in pulse noise amplitude due to a difference in parasitic capacitance between APD devices; a difference in quantum efficiency; a difference in amplitude between reverse-bias pulses applied; the non-linearity of an amplifier, as one of the results of electronic circuit implementation; differences in gain and loss; a difference in waveform disturbance due to signal reflection; and so on. There is a good possibility that these differences may cause a difference between the pulse noise waveforms outputted from two APDs. To solve this problem of differences, selection work is required to make the device characteristics of APDs equal. In addition, higher precision in implementation is also required. These requirements lead to an increase in cost and a decrease in yield.

SUMMARY OF THE INVENTION

An object of the present invention is to provide a pulse noise elimination method that can achieve an enhanced-speed photo receiver, and also a photo detecting circuit using this pulse noise elimination method.

Another object of the present invention is to provide a pulse noise elimination method and a photo detecting circuit that enable efficient elimination of a pulse noise without specially equalizing the characteristics of APDs and the like in use.

The present inventors drew their attention to the following two characteristics related to photo detection.

1) The waveform of a pulse noise is always in substantially the same shape, and the timing of its noise occurrence is apparent to a receiver. Accordingly, it is possible to perform pulse noise masking at a subsequent stage. Since the timing to apply a reverse-bias pulse corresponds to the timing maintained inside the receiver, the timing of occurrence of a pulse noise is also known to the receiver.

Moreover, an average waveform shape of a pulse noise does not change suddenly for the following two reasons. First, most pulse noises appear without any signal because, in practice, the incidence of output signals due to photon arrival or dark noise occurrence is very low. Second, the shape of a pulse noise only depends on deterioration over time in each element constituting a photon detector and on a change in temperature. Therefore, the waveform shape of a pulse noise changes sufficiently slowly as compared with the operating period of its electronic circuit.

2) The frequency of occurrence of a dark noise is relatively low as compared with the frequency of reception of a photon signal. This is because the incidence of dark noises can be controlled by lowering the temperature of an APD device. For example, in a practical quantum cryptography communication system, the frequency with which an APD receives a photon signal is 10%. By cooling the APD, the incidence of dark noises in photon reception signals can be controlled to 1% or lower, which is low enough if not perfectly.

With attention directed to these characteristics, the present inventors have solved the above-mentioned conventional problem by the following means.

According to a first aspect of the present invention, noises are eliminated from an output signal of a photo detecting device by generating a pulse noise mask signal indicating timing of occurrence of pulse noises based on a timing signal, and using the pulse noise mask signal to eliminate the pulse noises from the output signal of the photo detecting device. The pulse noise mask signal may be generated from the timing signal and a delayed timing signal which is obtained by delaying the timing signal by a predetermined delay time.

According to a second aspect of the present invention, noises are eliminated from an output signal of a photo detecting device by estimating a noise component by averaging a predetermined number of output signals of the photo detecting device, and subtracting the estimated noise component from a latest output signal of the photo detecting device to produce a photo reception signal. The estimated noise component is estimated by averaging the predetermined number of output signals of the photo detecting device to produce an average signal as the estimated noise component, wherein each of the output signals is obtained by sequentially applying the bias pulse voltage to the photo detecting device according the timing signal.

As described above, according to the first aspect of the present invention, a pulse noise mask signal is generated from the timing signal for indicating the timing to apply a bias pulse to a photo detecting device. By using this pulse noise mask signal, pulse noises are eliminated from the output signal of the photo detecting device.

Moreover, according to the second aspect of the present invention, by utilizing the fact that an average waveform generated by averaging of the output signals reflects a pulse noise waveform, the average waveform is regarded as an estimated pulse noise component and therefore pulse noises are eliminated from the output signal by using the estimated pulse noise component obtained by the averaging.

Accordingly, it is possible to efficiently eliminate a pulse noise at high speed, without the use of a subtraction or differential circuit employing coils, an operational amplifier or the like, hence without the need to select those APDs that exhibit no inherent differences in characteristics. In other words, the present invention enables high-speed photon detection and allows the inequality of APD characteristics, in particular, of parasitic capacitance and inductance and the inequality attributable to electronic circuit implementation.

Furthermore, according to the first aspect of the present invention, since the shape of a mask signal varies with a change in the time width of a reverse-bias pulse, the adjustment to the time position of a pulse noise can also be facilitated.

DETAILED DESCRIPTION OF THE PREFERRED EMBODIMENTS

1. First Embodiment 1.1) Circuit Configuration

Figure 1:
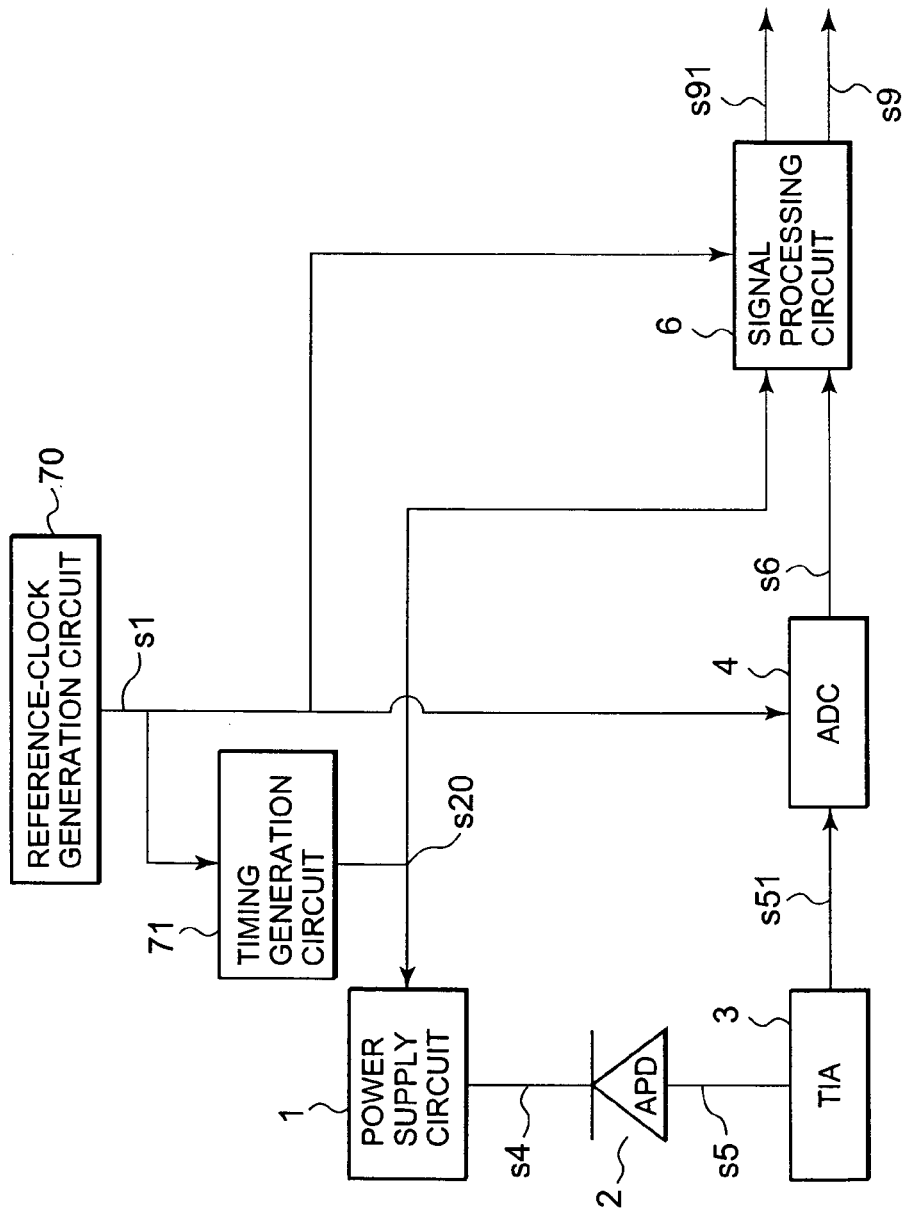
FIG. 1 is a block diagram showing a schematic configuration of a photo detecting circuit according to a first embodiment of the present invention.

FIG. 1 is a block diagram showing a schematic configuration of a photo detecting circuit according to a first embodiment of the present invention. The photo detecting circuit includes a power supply circuit 1, an avalanche photodiode (APD) 2 and a current-to-voltage conversion circuit 3. In addition to these, this photo detecting circuit is provided with a sampling circuit 4, a signal processing circuit 6, a reference-clock generation circuit 70, and a timing generation circuit 71.

The power supply circuit 1 generates a reverse-bias voltage s4 and applies it to the APD 2. This reverse-bias voltage includes a direct-current component that is less than the breakdown voltage VBd of the APD 2 and a reverse-bias pulse component that is not less than VBd. The reverse-bias pulse component is generated in synchronization with a reverse-bias-pulse timing signal s20 provided from the timing generation circuit 71.

When a photon arrives at the photo sensitive surface of the APD 2 while the reverse-bias pulse component is being applied to the APD 2, avalanche multiplication occurs due to an avalanche (electron avalanche) effect caused by photoelectrons generated, resulting in an electric current s5 being outputted. However, even when no incident photon comes in, an electric current s5 is outputted as a dark noise. Such an output electric current s5 includes a pulse noise caused by a reverse-bias pulse as described earlier.

The output electric current s5 is converted into a voltage signal (hereinafter, referred to as output current signal s51) by the current-to-voltage conversion circuit 3 and outputted to the sampling circuit 4. Here, a transimpedance amplifier (TIA) is used as the current-to-voltage conversion circuit 3.

The sampling circuit 4, in accordance with a reference clock signal s1, samples the output current signal s51 at a sampling granularity of two levels or more in the amplitude direction and outputs a discrete output current signal s6 to the signal processing circuit 6. The sampling circuit 4 may perform such binary sampling as to decide the signal by using two decision values, or may perform multiple-value sampling by using analog-to-digital (AD) conversion. Here, an AD converter (ADC) is used.

As will be described later, the signal processing circuit 6 performs signal processing for eliminating a pulse noise from the discrete output current signal s6 by utilizing the reverse-bias-pulse timing signal s20. The operation of the signal processing circuit 6 is also carried out in accordance with the reference clock signal s1.

The reference clock signal s1, according to which the sampling circuit 4 and signal processing circuit 6 operate, is generated by the reference-clock generation circuit 70 and is a high-speed clock signal having sufficient time accuracy compared with the reverse-bias-pulse timing signal s20 and output current signal s51.

1.2) Signal Processing Circuit

Figure 2:
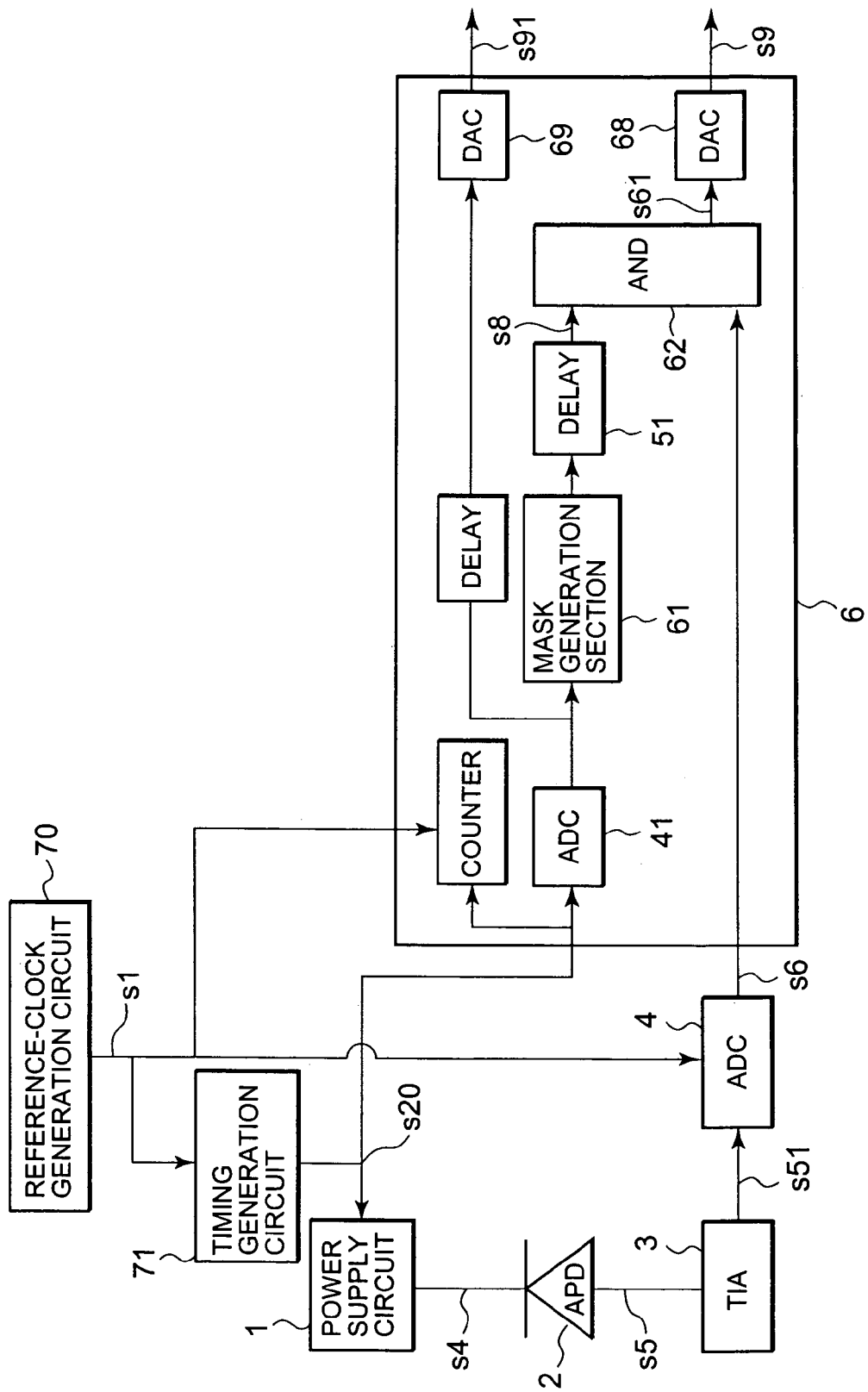
FIG. 2 is a block diagram illustrating in more detail the inside of a signal processing circuit 6 of the photo detecting circuit according to the first embodiment.

FIG. 2 is a block diagram illustrating in more detail the inside of the signal processing circuit 6 of the photo detecting circuit according to the first embodiment. Note, however, that only the configuration related to pulse noise masking processing is shown here.

The signal processing circuit 6 according to the first embodiment is a discrete signal processing system, and the timing of its entire operation is based on a counter. The counter carries out counting operation in accordance with the reference clock signal s1 and is reset by the reverse-bias-pulse timing signal s20. In other words, the counter operates in synchronization with the reverse-bias-pulse timing signal s20.

The reverse-bias-pulse timing signal s20, which is inputted from the timing generation circuit 71, is converted into a discrete timing signal by a sampling circuit 41. This sampling circuit 41, like the sampling circuit 4, also may perform such binary sampling as to decide the signal by using two decision values, or may perform multiple-value sampling by using analog-to-digital (AD) conversion. For the sampling circuit 41, however, the sampling using two decision values is more suitable because, unlike the output current signal s51, the reverse-bias-pulse timing signal s20 is a two-valued signal. The sampling operation of the sampling circuit 41 is also carried out in accordance with the reference clock signal s1 from the counter.

The sampled reverse-bias-pulse timing signal is inputted to a mask generation section 61 that generates a mask for eliminating a pulse noise. This pulse noise mask signal can be generated by, for example, delaying a sequence of the sampled reverse-bias-pulse timing signal corresponding to from a rising edge to a trailing edge of the reverse-bias-pulse timing signal s20 by the number of clock pulses equivalent to the time width of the mask, and then EXCLUSIVE-ORing (XORing) the subsequence not delayed and the subsequence delayed.

The generated pulse noise mask signal s8 is brought in phase with the discrete output current signal s6 by a delay circuit 51 and inputted to a pulse noise elimination circuit 62.

Note that the delay circuit 51 is provided in order to bring the pulse noise mask signal s8 and the discrete output current signal s6 in phase. Therefore, conversely, if the discrete output current signal s6 is advanced in phase with respect to the pulse noise mask signal s8, it will suffice that the delay circuit 51 is inserted into the path of the discrete output current signal s6.

The pulse noise elimination circuit 62 performs masking processing on the time region of a pulse noise in the discrete output current signal s6 by using the pulse noise mask signal, thereby eliminating the pulse noise. The pulse noise elimination can be achieved by simple processing such as logical AND, for example. Here, the pulse noise elimination is performed by AND of the two signals.

An obtained discrete output current signal s61, from which the pulse noise has been eliminated, is converted from the discrete data sequence to a continuous voltage signal by a signal discrimination conversion circuit 68 and outputted as a photon reception signal s9. The signal discrimination conversion circuit 68 performs conversion reverse to that of the sampling circuit 4, which is digital-to-analog conversion (DAC) here.

Incidentally, a clock signal can be run in parallel for the processing at the subsequent stages. Specifically, the reverse-bias-pulse timing signal sampled by the sampling circuit 41 is delay-adjusted so that it is matched to the discrete output current signal s61 from which the pulse noise has been eliminated, whereby a clock signal s91 is generated through another signal discrimination conversion circuit 69.

Additionally, the data sampled by the sampling circuits 4 and 41 may be subject to signal processing after being passed through a storage medium such as memory.

1.3) Noise Elimination by Masking

Figure 3:
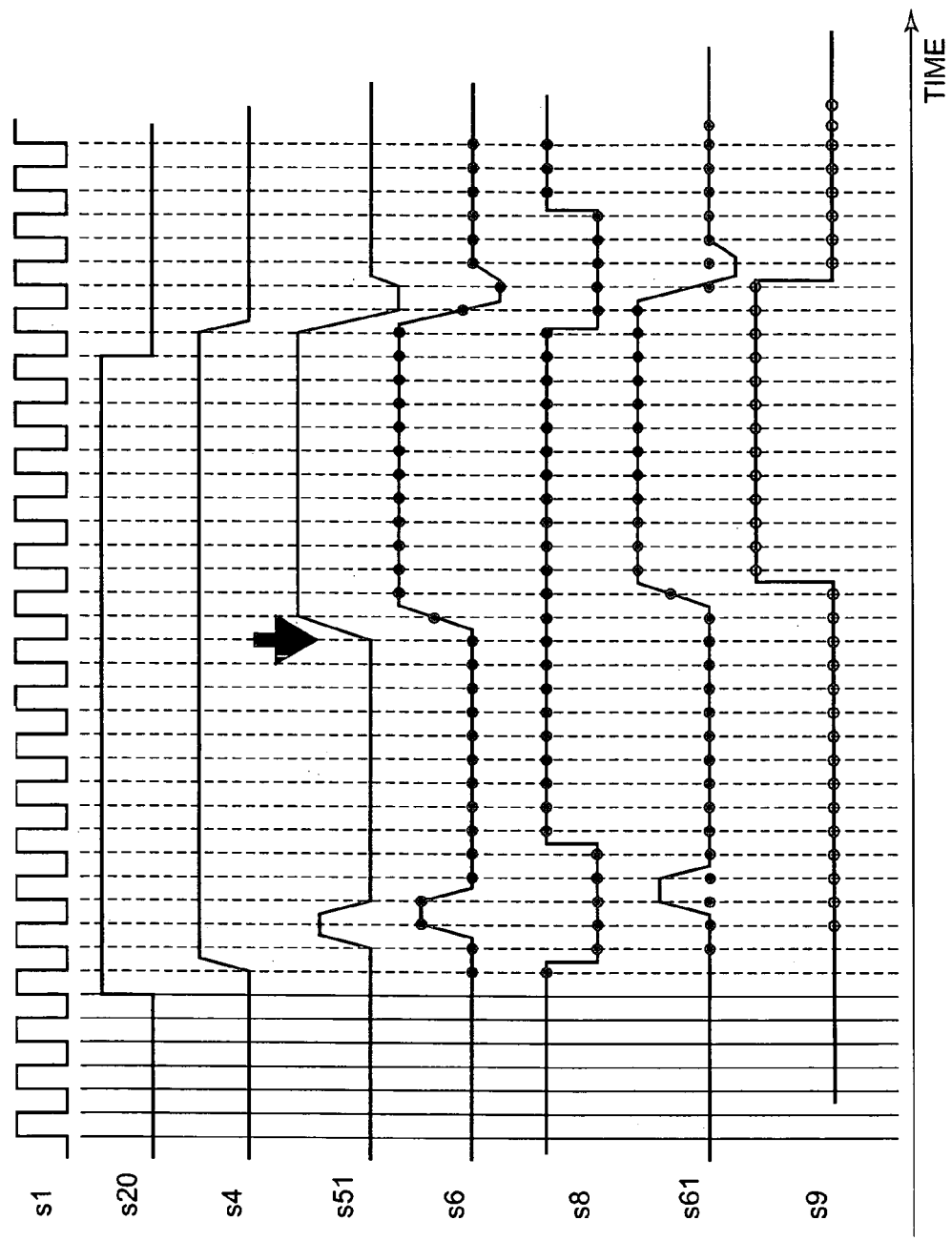
FIG. 3 is a time chart schematically showing the waveforms of principal signals in a photo detecting circuit, to describe noise masking processing in the first embodiment.

FIG. 3 is a time chart schematically showing the waveforms of principal signals in a photo detecting circuit, to explain the noise masking processing in the first embodiment. First, the timing generation circuit 71 generates the reverse-bias-pulse timing signal s20 based on the reference clock signal s1. In accordance with the reverse-bias-pulse timing signal s20, the power supply circuit 1 applies the reverse-bias signal (pulse) s4 to the APD 2. The reverse-bias signal s4 is slightly delayed relatively to the reverse-bias-pulse timing signal s20 due to a circuit delay inside the power supply circuit 1.

As for the output current signal s51 in FIG. 3, it is assumed that a photon arrives at the APD at a point in time indicated by the arrow while the reverse-bias pulse s4 is being applied. More specifically, in the output current signal s51, a narrow pulse as a differential waveform appears at a point corresponding to the rising edge of the reverse-bias pulse s4. After a while, when a photon arrives at the point in time indicated by the arrow, a breakdown of the APD 2 occurs, causing the amplitude of the output current signal s51 to rise and the amplitude is kept at a positive value. Finally, when the reverse-bias pulse s4 falls, the amplitude of the output current signal s51 also falls, at which a negative amplitude appears as a differential waveform accompanying the trailing edge of the reverse-bias pulse s4.

Sampling this output current signal s51 by the sampling circuit 4 produces a discrete output current signal s6. Here, through the sampling, the output current signal s51 becomes a discrete data sequence, represented by filled circles in FIG. 3, in which a delay appears due to the sampling.

Next, the reverse-bias-pulse timing signal s20 is sampled by the sampling circuit 41, and the pulse noise mask signal s8 is generated by the mask generation section 61. Here, the sampled reverse-bias-pulse timing signal s20 is delayed and XORed with the reverse-bias-pulse timing signal s20 that is not delayed, thereby generating the pulse noise mask signal s8 in which a time region to perform masking is set at 0 and a time region to perform no masking is set at 1.

The masking operation is performed by the pulse noise elimination circuit 62 ANDing the discrete output current signal s6 with the pulse noise mask signal s8, obtaining the discrete output current signal s61 in which the pulse noises have been masked. The signal discrimination conversion circuit 68 performs logical decision on the discrete output current signal s61 and conversion from the discrete data sequence to a continuous voltage signal, whereby outputting the photon reception signal s9.

As described above, according to the first embodiment, a pulse noise mask signal is generated from the reverse-bias-pulse timing signal s20 for indicating the timing to apply a reverse-bias pulse to the APD 2, and pulse noise portions are eliminated from a photocurrent signal by using the pulse noise mask signal. Accordingly, pulse noises can be efficiently eliminated at high speed, without the use of a subtraction circuit employing coils or an operational amplifier. Moreover, since the pulse noise mask signal varies with a change in the time width of a reverse-bias pulse, adjustment to the time position of a pulse noise is also easily performed.

2. Second Embodiment

2.1) Circuit Configuration

Figure 4:
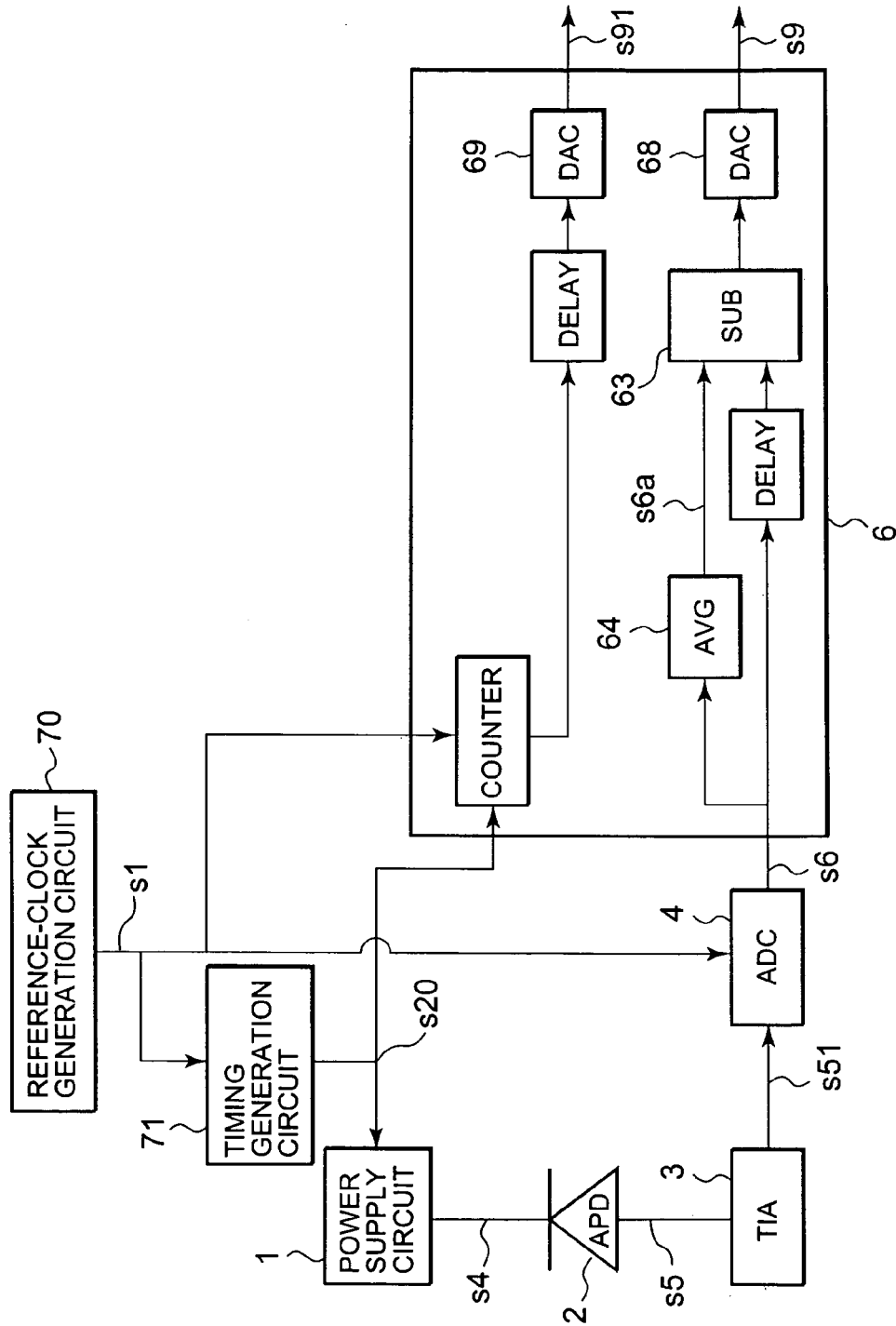
FIG. 4 is a block diagram showing a configuration of a photo detecting circuit according to a second embodiment of the present invention.

FIG. 4 is a block diagram showing a configuration of a photo detecting circuit according to a second embodiment of the present invention. According to the second embodiment, the signal processing circuit 6 includes an averaging processing section 64 and a subtraction circuit 63, which are designed to calculate an average value s6a for the discrete output current signal s6 and to subtract the average value s6a from the present discrete output current signal s6. The averaging processing section 64 can produce the average of the waveforms of pulse noises according to the cycle of the counter and the subtraction circuit 63 can eliminate a pulse noise from the present discrete output current signal s6. Note that the other configuration and operation are substantially the same as those described in conjunction with FIG. 2. Therefore, the same reference numerals and symbols as in FIG. 2 are used here, and a description thereof will be omitted.

Referring to FIG. 4, the averaging processing section 64 operates in accordance with the counter which operates according to the reference clock signal s1 and is reset by the reverse-bias-pulse timing signal s20, and averages consecutive sequences of the discrete output current signal s6. In this averaging processing, a finite number of multiple waveforms are averaged.

A delay circuit is provided, if necessary, to make the average output current signal s6a, which is the obtained average waveform, in phase with the present discrete output current signal s6, which is the currently outputted sequence of the discrete output current signal s6. Pulse noise elimination is carried out by the subtraction circuit 63. The amount of delay at the delay circuit may be equivalent to a period of time required for the averaging processing, or may be set to an amount of delay that allows the present discrete output current signal s6 to be in phase with a average signal s6a that has been outputted until one cycle previous to the present discrete output current signal s6.

Additionally, data sampled by the sampling circuit 4 may be stored in a storage medium such as a memory before the subsequent signal processing in the signal processing circuit 6.

In parallel with the averaging processing, a clock signal s91 for the output signal s9 can also be generated. At the request of a circuit at the subsequent stage, the phase of the clock signal s91 needs to be adjusted within a certain specific phase range relative to the output signal s9, which is a photon reception signal.

2.2) Noise Estimation by Averaging

Figure 5:
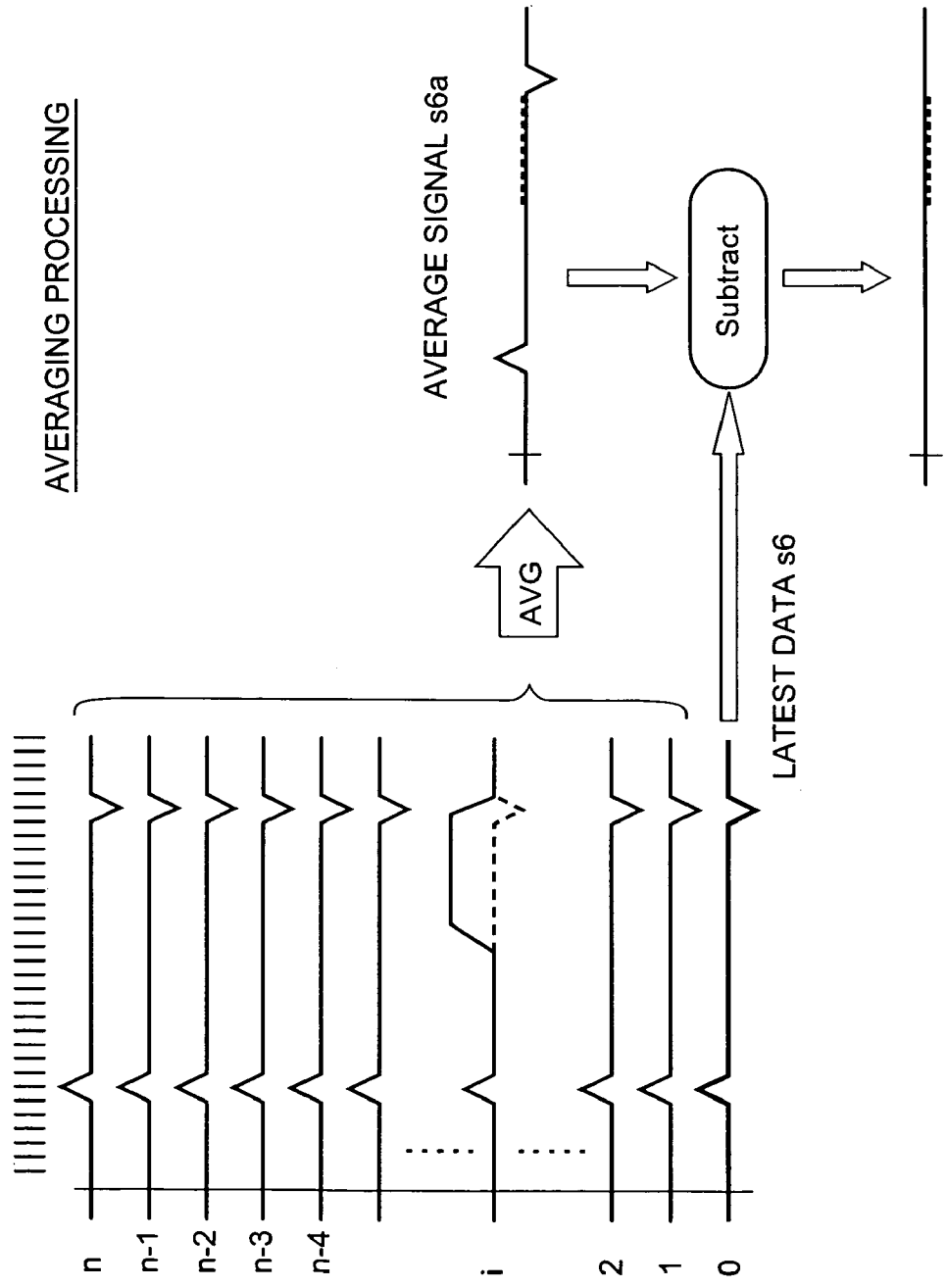
FIG. 5 is a schematic diagram of signal waveforms, to describe a pulse noise elimination method using averaging processing according to the second embodiment.

FIG. 5 is a schematic diagram of signal waveforms, to describe a pulse noise elimination method using the averaging processing according to the second embodiment. For convenience of explanation, a discrete output current signal s6(j) represents a sequence of the discrete output current signal s6 outputted j cycles previous to the present. In addition, it is assumed that a discrete output current signal s6(0) is the present sequence of the discrete output current signal s6 and a discrete output current signal s6(n) is the oldest sequence of the discrete output current signal s6 in the averaging processing, which was outputted n cycles before. Accordingly, at the point of time 0, the discrete output current signals s6(n)-s6(1) are related to averaging processing.

With respect to the latest discrete output current signal s6(0), the averaging processing section 64 averages the waveforms of consecutive sequences from the one-cycle-old discrete output current signal s6(1) to the n-cycle-old discrete output current signal s6(n), thereby obtaining an average waveform (AVG) which corresponds to an average signal s6a. As described above, since discrete output current signals always contain pulse noises, the average waveform (AVG) reflects these pulse noises and is regarded as an estimated pulse noise. Accordingly, a pulse noise can be eliminated from the latest-waveform signal by subtracting the average waveform (AVG) as an estimated pulse noise from the latest discrete output current signal s6(0).

There is a possibility that the n consecutive discrete output current signals s6(1) to s6(n) might include a signal s6(i) having an arriving-photon reception waveform. However, as is well known, the probability that a photon arrives at a photon receiver is extremely low because those photons transmitted from a photon transmitter are lost with a probability due to the loss in a transmission medium during the process of propagation. If the arriving photons are viewed as the signal pulses outputted from an APD, the mark rate of the signal is far lower than that of a signal detected by a classical photo receiver. If the loss in a practical transmission medium is assumed, the mark rate of a signal outputted from an APD, for example, could be a very low value ranging approximately from 10% to 1%. As stated above, the proportion of chances of reception of a photon and occurrence of a dark noise to all the time slots is very small. Therefore, it is entirely feasible, by carrying out the n-waveform averaging processing, to set the amount of influence that the signal waveforms and/or dark noise waveforms will exert on the average waveform, to a very small degree.

Moreover, for the signal s6(i) having the arriving-photon detection waveform, the average is also taken similarly for n waveforms of the past signals s6(i−1) to s6(i−1+n). Therefore, by subtracting this average waveform from the discrete output current signal s6(i), it is possible to detect a signal waveform from which a pulse noise is eliminated. Note that, in the case where this photon detection signal has been detected, it is also possible that the discrete output current signal s6(*i*) in question will not be used in the averaging processing thereafter.

Incidentally, the clock signal s91 generated in parallel with the averaging processing is a signal dependent on the reverse-bias-pulse timing signal s20. Accordingly, it is suitable to generate the clock signal s91 by passing a signal from the counter in the signal processing circuit 6 through a suitably adjusted delay as described in conjunction with FIG. 4, or to generate the clock signal s91 from the reverse-bias-pulse timing signal s20 as shown in FIG. 6.

2.3) Modification

Figure 6:
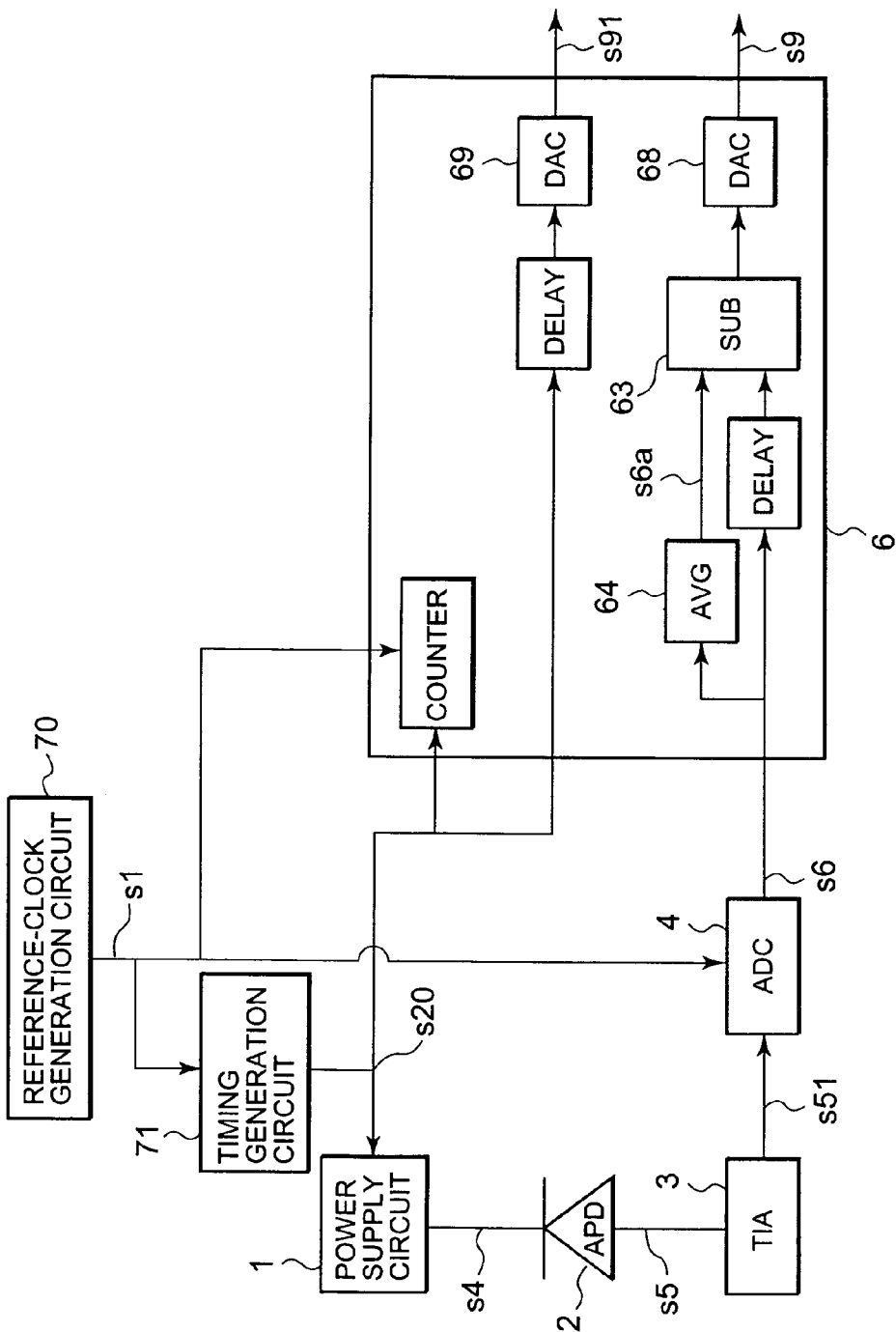
FIG. 6 is a block diagram showing a modified example of the second embodiment of the present invention.

FIG. 6 is a block diagram showing a modified example of the second embodiment of the present invention. The clock signal s91 may also be generated by delaying the reverse-bias-pulse timing signal s20 and then passing it through the signal discrimination conversion circuit 69.

As described above, utilizing the fact that an average waveform obtained by the output current signal averaging processing substantially reflects a pulse noise waveform, the photo detecting circuit according to the second embodiment of the present invention eliminates a pulse noise estimated by the averaging processing from an output current signal. Accordingly, a pulse noise can be efficiently eliminated at high speed, without the use of a subtraction circuit employing coils, an operational amplifier or the like.

3. Applications

The photo detecting circuit according to the above-described first or second embodiment is applicable to each of two APDs independently. Even if the APDs are different from each other in characteristics and electric circuitry implementation, the photo detecting circuits can individually carry out the processing, without being affected by each other.

Figure 7:
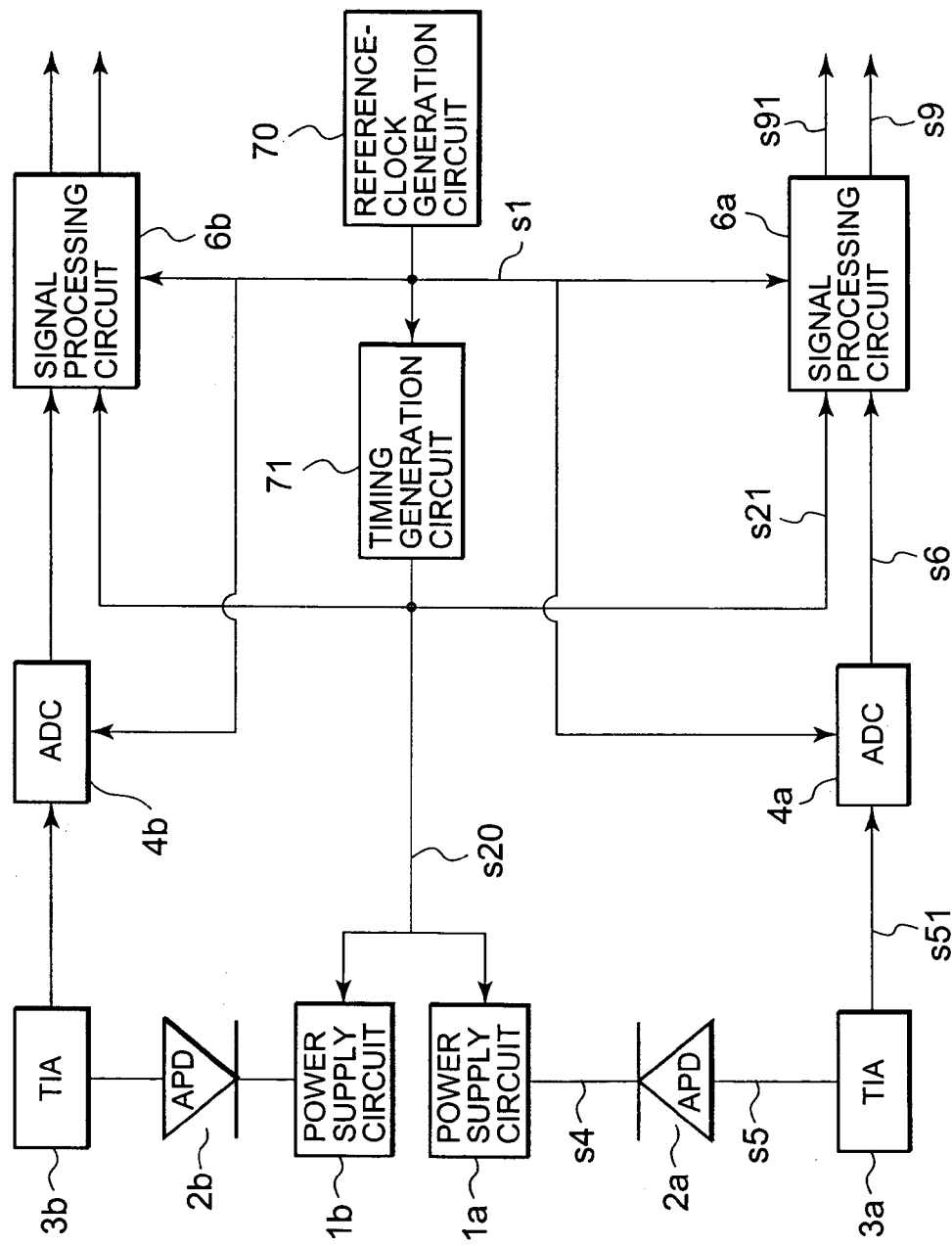
FIG. 7 is a block diagram of a photo receiver having two APDs to which the present invention is applied.

FIG. 7 is a block diagram of a photo detecting circuit having two APDs to which the present invention is applied. Here, a circuit similar to that of FIG. 1 is configured for each of the two APDs 2a and 2b. Therefore, those blocks similar to those shown in FIG. 1 are given the same reference numerals with the addition of "a" or "b", and a detailed description thereof will be omitted.

As described above, since pulse noise elimination is carried out in the flow of output processing related to each APD independently, the problems are overcome that are dependent on the differences in characteristics between the APDs, which have been obstacles to the analog waveform subtraction which has been conventionally performed by a balun transformer. In other words, it is possible to remove the limit of speed, selection work, and a decrease in yield, which all result from the use of two APDs in pair.

In addition to the application to photon receivers in quantum encryption communications, the photo detecting circuit according to the present invention can be also applicable to a photon detector for use in general optical communications and a photo measurement device for use in optical measurement.

The invention claimed is:

1. A photo detecting circuit using a photo-detecting device, comprising:
 a timing generator for generating a timing signal;
 a power supply for applying a bias pulse voltage to the photo-detecting device according to the timing signal;
 an estimator for estimating a noise component by averaging output signals of the photo-detecting device; and
 a subtraction section for subtracting the estimated noise component from an output signal of the photo-detecting device to produce a photo reception signal,
 wherein the estimator averages the output signals of the photo-detecting device, wherein each of the output signals of the photo detecting device correspond to pulse noises, to produce an average signal as the estimated noise component, wherein each of the output signals is obtained by sequentially applying the bias pulse voltage to the photo-detecting device according to the timing signal, and wherein the estimator performs averaging in synchronization with the timing signal generated by the timing generator.

2. The photo-detecting circuit according to claim 1, wherein the output signal of the photo-detecting device is converted into a discrete sampled signal before entering the averaging section and the subtraction section.

3. The photo-detecting circuit according to claim 1, wherein the photo-detecting device is an avalanche photodiode (APD), wherein a pulse noise is caused by a differentiation operation of parasitic capacitance of the avalanche photodiode to which the bias pulse voltage is applied.

4. A photon receiver comprising the photo-detecting circuit according to claim 1.

5. A photon receiver for use in quantum encryption communication system, comprising the photo-detecting circuit according to claim 1.

6. A photo measurement device comprising the photo-detecting circuit according to claim 1.

7. The photo-detecting circuit according to claim 1, wherein the timing signal corresponds to a reverse-bias-pulse timing signal, and wherein the reverse-bias-pulse timing signal is a two-valued signal.

8. The photo-detecting circuit according to claim 1, wherein the timing signal corresponds to a reverse-bias-pulse timing signal,
 the photo-detecting circuit further comprising:
 a delay circuit for delaying the reverse-bias-pulse timing signal by a predetermined timing, and for outputting a delayed reverse-bias-pulse timing signal as a clock signal for the photo-detecting device.

9. A method for eliminating noises from an output signal of a photo-detecting device, comprising:
 generating a timing signal;
 applying a bias pulse voltage to the photo-detecting device according to the timing signal;
 estimating a noise component by averaging output signals of the photo-detecting device; and
 subtracting the estimated noise component from an output signal of the photo-detecting device to produce a photo reception signal,
 wherein the estimating step averages the output signals of the photo-detecting device, wherein each of the output signals of the photo detecting device correspond to pulse noises, to produce an average signal as the estimated noise component,
 obtaining each of the output signals by sequentially applying the bias pulse voltage to the photo-detecting device according to the timing signal,
 wherein the estimating step performs averaging in synchronization with the timing signal generated by the generating step.

10. The method according to claim 9, wherein the estimated noise component is estimated by averaging the predetermined number of output signals of the photo-detecting device to produce an average signal as the estimated noise component, wherein each of the output signals is obtained by sequentially applying the bias pulse voltage to the photo-detecting device according the timing signal.

11. The method according to claim 9, wherein the timing signal corresponds to a reverse-bias-pulse timing signal, and wherein the reverse-bias-pulse timing signal is a two-valued signal.

12. The method according to claim 9, wherein the timing signal corresponds to a reverse-bias-pulse timing signal, the method further comprising:
   delaying, by a delay circuit, the reverse-bias-pulse timing signal by a predetermined timing, to obtain a delayed reverse-bias-pulse timing signal; and
   outputting the delayed reverse-bias-pulse timing signal as a clock signal for the photo-detecting device.

13. A computer readable medium embodying a program instructing a computer to eliminate noises from an output signal of a photo-detecting device, the program when executed by the computer, causing the computer to perform the steps of:
   generating a timing signal;
   applying a bias pulse voltage to the photo-detecting device according to the timing signal;
   estimating a noise component by averaging output signals of the photo-detecting device; and
   subtracting the estimated noise component from a latest output signal of the photo-detecting device to produce a photo reception signal,
   wherein the estimating step averages the output signals of the photo-detecting device, wherein each of the output signals of the photo detecting device correspond to pulse noises, to produce an average signal as the estimated noise component,
   obtaining each of the output signals by sequentially applying the bias pulse voltage to the photo-detecting device according to the timing signal,
   wherein the estimating step performs averaging in synchronization with the timing signal generated by the generating step.

14. The computer readable medium according to claim 13, wherein the timing signal corresponds to a reverse-bias-pulse timing signal, and wherein the reverse-bias-pulse timing signal is a two-valued signal.

15. The computer readable medium according to claim 13, wherein the timing signal corresponds to a reverse-bias-pulse timing signal, the computer further performing the steps of: delaying, by a delay circuit, the reverse-bias-pulse timing signal by a predetermined timing, to obtain a delayed reverse-bias-pulse timing signal; and outputting the delayed reverse-bias-pulse timing signal as a clock signal for the photo-detecting device.

* * * * *